United States Patent

Ji et al.

[11] Patent Number: 6,081,479
[45] Date of Patent: Jun. 27, 2000

[54] HIERARCHICAL PREFETCH FOR SEMICONDUCTOR MEMORIES

[75] Inventors: Brian Ji, Fishkill; Toshiaki Kirihata, Poughkeepsie; Gerhard Mueller, Wappingers Falls; David Hanson, Brewster, all of N.Y.

[73] Assignees: Infineon Technologies North America Corp., San Jose, Calif.; International Business Machines Corporation, Armonk, N.Y.

[21] Appl. No.: 09/333,539

[22] Filed: Jun. 15, 1999

[51] Int. Cl.⁷ ........................................ G11C 8/00
[52] U.S. Cl. .................... 365/233; 365/220; 365/221
[58] Field of Search ........................ 365/233, 238.5, 365/189.05, 220, 221, 230.03

[56] References Cited

U.S. PATENT DOCUMENTS

| | | | |
|---|---|---|---|
| 4,933,846 | 6/1990 | Humphrey et al. | 364/200 |
| 5,291,580 | 3/1994 | Bowden, III et al. | 395/425 |
| 5,471,591 | 11/1995 | Edmondson et al. | 395/375 |
| 5,663,924 | 9/1997 | Barth, Jr. et al. | 365/230.03 |
| 5,768,212 | 6/1998 | Fujita | 365/230.08 |
| 5,802,005 | 9/1998 | Nakamura et al. | 365/230.03 |
| 5,812,473 | 9/1998 | Tsai | 365/205 |
| 5,835,443 | 6/1990 | Fujita | 365/233 |
| 5,923,595 | 7/1999 | Kim | 365/189.05 |

*Primary Examiner*—Richard Elms
*Assistant Examiner*—Hien Nguyen
*Attorney, Agent, or Firm*—Stanton C. Braden

[57] ABSTRACT

A semiconductor memory in accordance with the present invention includes a data path including a plurality of hierarchical stages, each stage including a bit data rate which is different from the other stages. At least two prefetch circuits are disposed between the stages. The at least two prefetch circuits include at least two latches for receiving data bits and storing the data bits until a next stage in the hierarchy is capable of receiving the data bits. The at least two prefetch circuits are coupled between stages such that an overall data rate per stage between stages are substantially equal. Control signals control the at least two latches such that prefetch circuits maintain the overall data rate between the stages.

23 Claims, 5 Drawing Sheets

HIERARCHICAL PREFETCH FOR SEMICONDUCTOR MEMORIES

BACKGROUND

1. Technical Field

This disclosure relates to semiconductor memories and more particularly, to a hierarchical prefetch method and apparatus for increasing overall data rate or bandwith for semiconductor memories.

2. Description of the Related Art

Dynamic Random Access Memory (DRAM) is utilized in various electronic systems for storing large amounts of digitally encoded information. The data rate of DRAMs have become more critical since microprocessors are operating at ever increasing clock speeds. This requires DRAM devices to have much faster data rates for both reading and writing functions to keep pace with the microprocessors. The data rate of the DRAM is limited by the access speed from the address input to data input/output, which requires a signal travel along a number of circuits, a receiver, a driver, a decoder and sense amplifier. This access speed is not easy to improve upon without improving the process technology to a faster device speed.

A number of techniques have therefore been developed to increase the data rate with circuit technologies. One such technique is known as "pre-fetching", which is disclosed in U.S. Pat. No. 5,285,421, entitled SCHEME FOR ELIMINATING PAGE BOUNDARY LIMITATION ON INITIAL ACCESS OF A SERIAL CONTIGUOUS ACCESS MEMORY, issued on Feb. 8, 1994 and U.S. Patent No. 5,392,239 to Margulis et al., entitled BURST MODE DRAM, issued on Feb. 21, 1995.

The "pre-fetching" technique takes advantage of the burst access pattern by latching additional data for the subsequent burst pattern into a register, in addition to the data corresponding to the specified address. The "prefetching" technique, more particularly receives an initial address and subsequent addresses are generated internally within a DRAM. The internal address generation is much faster than receiving subsequent addresses externally, substantially improving the access of the subsequent burst pattern if the subsequent data are available. By storing the additional data fetched in the register as a prefetch, subsequent data may be accessed in the time the subsequent address is generated. Thus, the total time for completing a number of sequential accesses is reduced, improving the data rate of the burst access patterns as large as the number of the prefetch.

The data rate of 200 Mb/sec or beyond is realized for a 256 Mb DRAM with 2-bit prefetch. The prior art includes a DQ block (input/output pins) where 2 Read/Write Driver's (RWDs) bus lines are steered into each DQ. This improves a data rate as fast as two times the data rate without prefetching. Increases in prefetch, however, come at a high cost to chip size overhead.

Therefore, a need exists for a hierarchical prefetch method and apparatus for increasing data rate or bandwith while maintaining low chip size overhead for semiconductor memories.

SUMMARY OF THE INVENTION

A semiconductor memory in accordance with the present invention includes a data path including a plurality of hierarchical stages, each stage including a bit data rate which is different from the other stages. At least two prefetch circuits are disposed between the stages. The at least two prefetch circuits include at least two latches for receiving data bits and storing the data bits until a next stage in the hierarchy is capable of receiving the data bits. The at least two prefetch circuits are coupled between stages such that overall data rates per stage between stages are substantially equal. Control signals control the at least two latches such that prefetch circuits maintain the overall bit rates between the stages.

In alternate embodiments, the prefetch circuits preferably have a depth of 8 bits. The plurality of stages may include a first stage low in the hierarchy and a second stage higher in the hierarchy having a prefetch circuit therebetween, the prefetch circuit having a depth greater than or equal to a quotient of a bit data rate of the first stage divided by a bit data rate of the second stage with any fraction rounded up to the nearest integer. The stages may include one of sense amplifiers and first-in/first-outs. The semiconductor memory preferably includes an overall data rate of greater than 400 megabits per second. The hierarchical stages may be configured with hierarchical data lines over an array of memory cells and read/write drivers. The overall data rate between stages may be calculated by multiplying prefetch depth by the bit data rate for the stage.

A semiconductor memory chip includes a memory array having sections, each section having four quadrants, each quadrant including an odd column and an even column of memory cells. A data path associated with each quadrant includes local data lines for transmitting memory data. The local data lines are coupled to a first stage which includes first sense amplifier circuits, the first stage being coupled to a second stage including second sense amplifier circuits by master data lines. The second stage is coupled to a third stage including a first-in/first-out/off chip driver circuit by read/write driver lines, and the first-in/first-out/off chip driver circuit is coupled to an input/output pin. At least two latch circuits are disposed within the stages for providing prefetch capability for data to be transmitted through the data path, the at least two latch circuits for receiving data bits and storing the data bits until a next stage in the data path is capable of receiving the data bits. The at least two latch circuits are associated with the stages such that overall data rates between the stages are substantially equal to a desired data rate per stage. Control signals control the at least two latch circuits such that prefetch capability is provided to maintain the data rates between the stages.

In alternate embodiments, the semiconductor memory chip preferably has a prefetch depth of 8 bits. The prefetch depth may be distributed as 4 bits at the second stage and 2 bits at the third stage. The prefetch depth may be distributed as 2 bits at the first stage, 2 bits at the second stage and 2 bits at the third stage. The prefetch depth may include a value greater than or equal to a quotient of a bit data rate of one stage divided by a bit data rate of another stage with any fraction rounded up to the nearest integer. The semiconductor memory chip preferably includes an overall data rate of greater than 400 megabits per second. The control signals may include pointer signals for transferring the data between the stages in a correct burst sequence. The semiconductor memory chip is preferably a synchronous DRAM chip. The second stage may include switches for enabling the second stage and the control signals may include pointer signals for activating and deactivating the switches. The third stage may include switches for enabling the third stage and the control signals may include control signals for activating and deactivating the switches. A bit data rate for the first stage may be about 20 ns per bit. A bit data rate for the second stage may be between about 10 ns per bit to about 20 ns per bit.

A bit data rate for the third stage may be about 5 ns per bit. The semiconductor memory chip may further include a control circuit for incrementing addresses from one of even and odd starting addresses to provide sequential addresses for generating the control signals. The semiconductor memory chip may further include a control circuit for formulating addresses from one of even and odd starting addresses to provide interleaved addresses for generating the control signals. The overall data rate between stages may be calculated by multiplying prefetch depth by the bit data rate for the stage.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor memories and more particularly, to a hierarchical prefetch method and apparatus for increasing data rate or bandwith for the semiconductor memories with low chip size overhead. Increasing the operation frequency and bandwidth of dynamic random access memories (DRAMs) has attracted more attention in contemporary designs. In this invention, hierarchical prefetch for read and write accesses in a column/data path in DRAMs is disclosed. The present invention implements two or more prefetch stages hierarchically in a number of circuit blocks in the column/data path, such as FIFO/OCD (First In First Out/Off Chip Driver), SSA (Second Sense Amplifier), SA (Sense Amplifier), etc. Using hierarchical prefetch, in accordance with the present invention, the bit data rate is optimized for each hierarchical data path stage, thus improving the overall data rate with small design overhead.

One aspect of the invention is to arrange optimum prefetch at each hierarchical data path stage, where the optimum number of prefetch for a given stage is chosen so that the stage would no longer be a bottleneck of the data path. One implementation example is an 8-bit hierarchical prefetch which may be used for synchronous DRAMs (SDRAM), wherein 2 bit prefetch is implemented in FIFO/OCD to steer RWDe and RWDo for each DQ, and 4-bit prefetch is used in SSAs to steer MDQ<0:3> to each RWD. Other chips which may implement the present invention include rambus DRAMs (RDRAM) or SyncLink DRAMs (SLDRAMs). Both sequential and interleaved bursts with even or odd starting addresses may be supported in accordance with the present invention.

Figure 1:
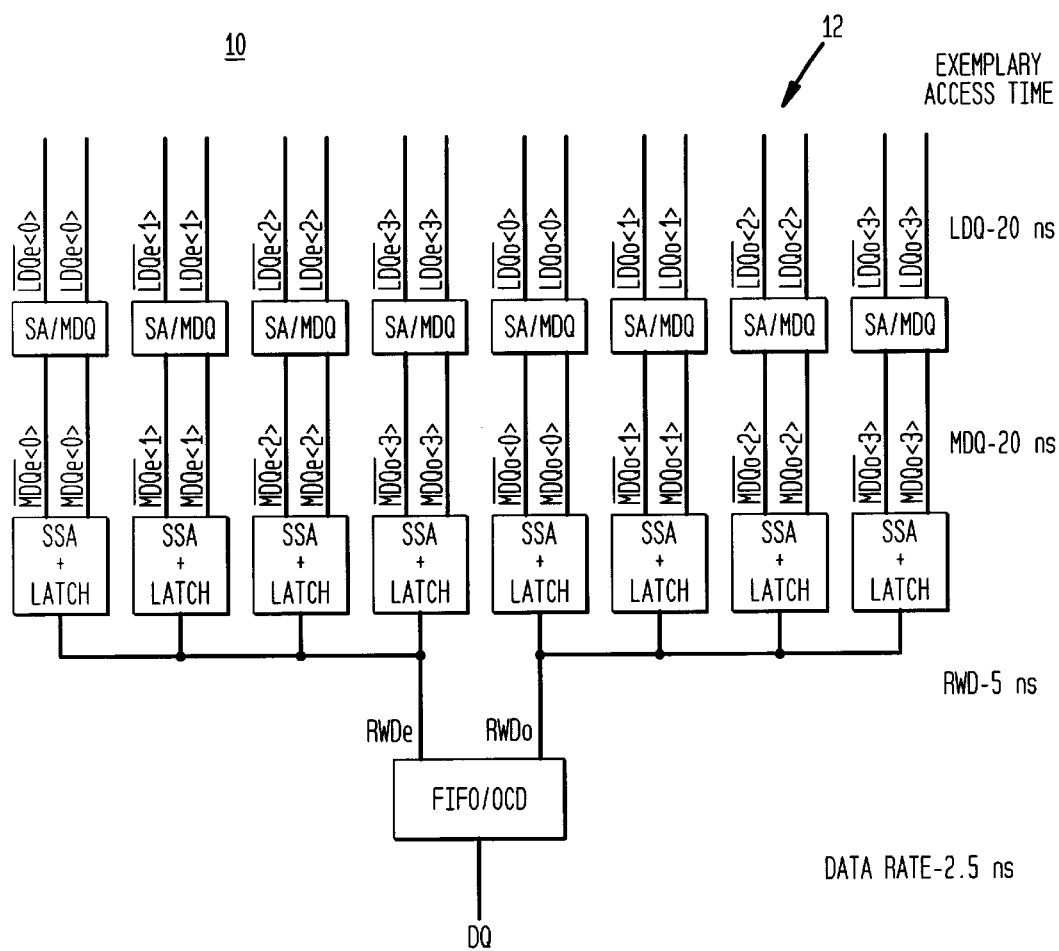
FIG. 1 is a block diagram showing a memory circuit having a hierarchical data path with prefetch in accordance with the present invention.

Referring now in specific detail to the drawings in which like reference numerals identify similar or identical elements throughout the several views, and initially to FIG. 1, a hierarchical prefetch scheme in a column/data path for a large density memory device 10 is illustratively shown. The prefetch scheme is provided at various circuit blocks in the column data path, such as at one or more of FIFO/OCD, SSA., SA, etc. Some advantages of the present invention are described in greater detail below.

The hierarchical prefetch in accordance with the present invention provides an improved data rate with little or no chip size overhead increases. Advantageously, this is achieved by arranging the data path in hierarchical stages in two or more of the stages of local data lines (LDQ), master data lines (MDQ), read/write drivers (RWD), and off chip driver (OCD), i.e., data output. Overall performance improvement of the read/write column/data path data rate is improved, since no single hierarchical stage restricts the data rate, resulting in an optimum overall data rate. The present prefetch scheme is determined using circuit delay information. Prefetch is designed into the system, for example into a DRAM or SDRAM chip such that delays are minimized at bottlenecks, i.e., places where the circuit is slowest thereby holding up circuits either before or after the bottleneck. Note that the chip data rate is not improved if one data path stage such as SSA, for example, is slower than others without prefetch. This would be an example of a bottleneck The hierarchical prefetch at different circuit blocks (at different locations) also results in a saving of wiring area/ layout area and power consumption unlike a conventional single stage prefetch. FIG. 1 illustratively shows an example of an 8 bit hierarchical prefetch circuit 12 where 4 bit prefetch is performed at second sense amplifier (SSA) double-latches to support one RWD/4 MDQs (note that SSA itself is a latch and an additional latch is preferably added to assist in prefetching) and 2 bit prefetch is done at FIFO (first in-first out)/OCD double-latches to support one DQ/ 2 RWDs. For read access, a multiple number of SSAs (eight SSAs for each DQ as shown in FIG. 1, other multiple numbers, such as 4 or 16 may be used as well) are simultaneously activated at the read command, sensing the array and keeping the data in the SSA master-salve double-latches (note that SSA itself is a latch). Then predecoded pointer control signals (see FIG. 5) steer data of the SSA double-latches to a multiple number of RWDs (two for each DQ as illustratively shown in FIGS. 1 and 2). Finally, the arriving data of two 4-bit pockets from the RWDe and RWDo are latched in OCD/FIFO double-latches and steered out by control pointers (see FIG. 5) to DQ pins in an 8 bit burst operation, hence 8 bit prefetch. The write access is performed in reverse of the read operation.

In the example shown in FIG. 1, if the target is to achieve an overall data rate of about 400 Mb/s (~2.5 ns for each bit), then, the RWD bit data (transfer) rate is preferably about 5 ns per bit due to 2 bit prefetch at FIFO/OCD. Then, due to the further 4 bit prefetch at the SSA, the MDQ required data (transfer) rate per bit is preferably about 20 ns which is also the preferable access time for LDQ. Thus the RWD, MDQ and LDQ data (transfer) rate per bit are relaxed by a factor of 2, 8 and 8 (i.e., 5/2.5, 20/2.5 and 20/2.5) from the data rate, respectively. The data (transfer) rate per bit described in the example is illustrative only and not limiting. The prefetch scheme as described may be extended to achieve higher or lower data rates then those described depending on the design of the circuit. Note that this two stage 8$b$ hierarchical prefetch is much more efficient than a conventional 1 stage 8*b* prefetch which requires 4 times more RWDs because of the 8*b* prefetch per DQ.

Figure 2:
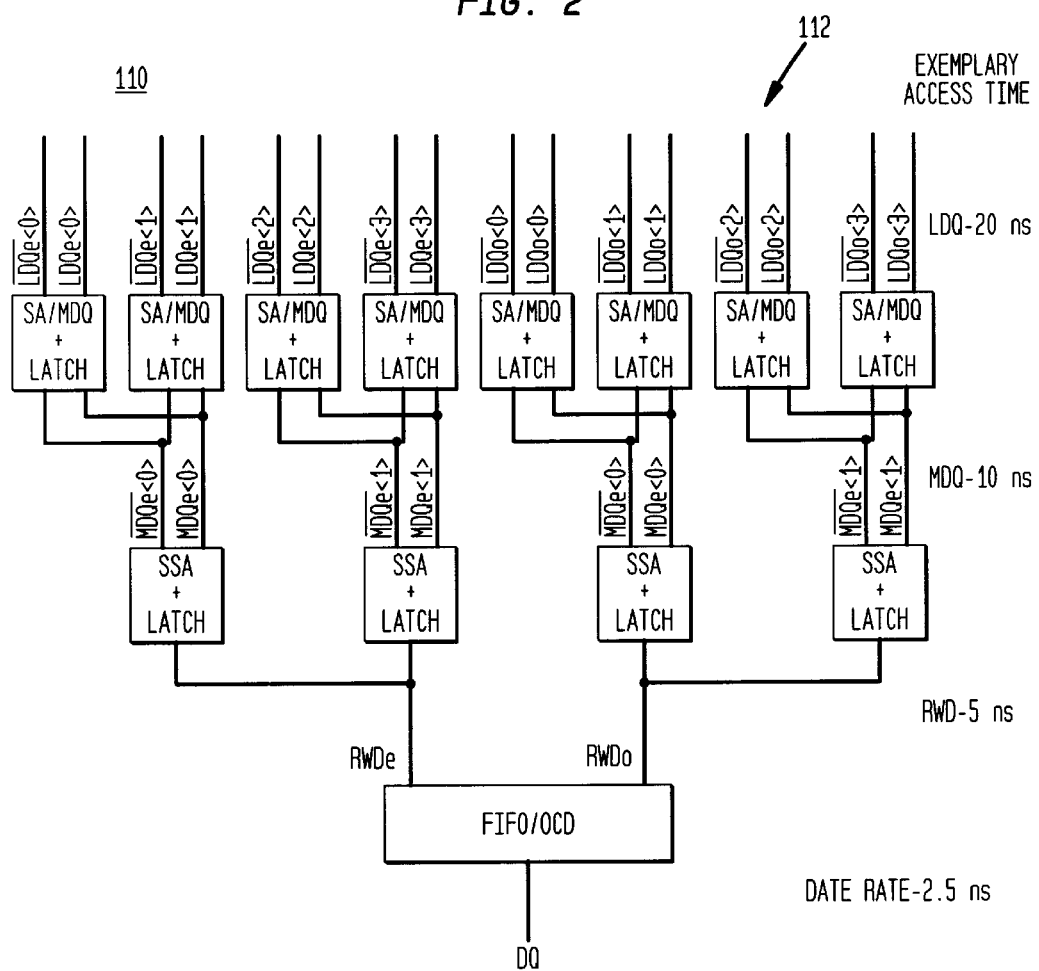
FIG. 2 is a block diagram showing another embodiment of the memory circuit of FIG. 1 having a hierarchical data path with prefetch in accordance with the present invention.

Referring to FIG. 2, another illustrative example of an 8 bit hierarchical prefetch circuit 112 is shown for a semiconductor memory 110 where 2 bit prefetch is performed at SA double-latches (SA latch plus an additional latch), 2 bit prefetch at SSA double-latches (SSA latch plus an additional latch), and 2 bit prefetch at FIFO/OCD double-latches. Here the RWD, MDQ and LDQ data rates per bit are relaxed by a factor of 2, 4, 8 (i.e., 5/2.5, 10/2.5 and 20/2.5) from the overall data rate (about 400 Mb/s (~2.5 ns), respectively.

Figure 4:
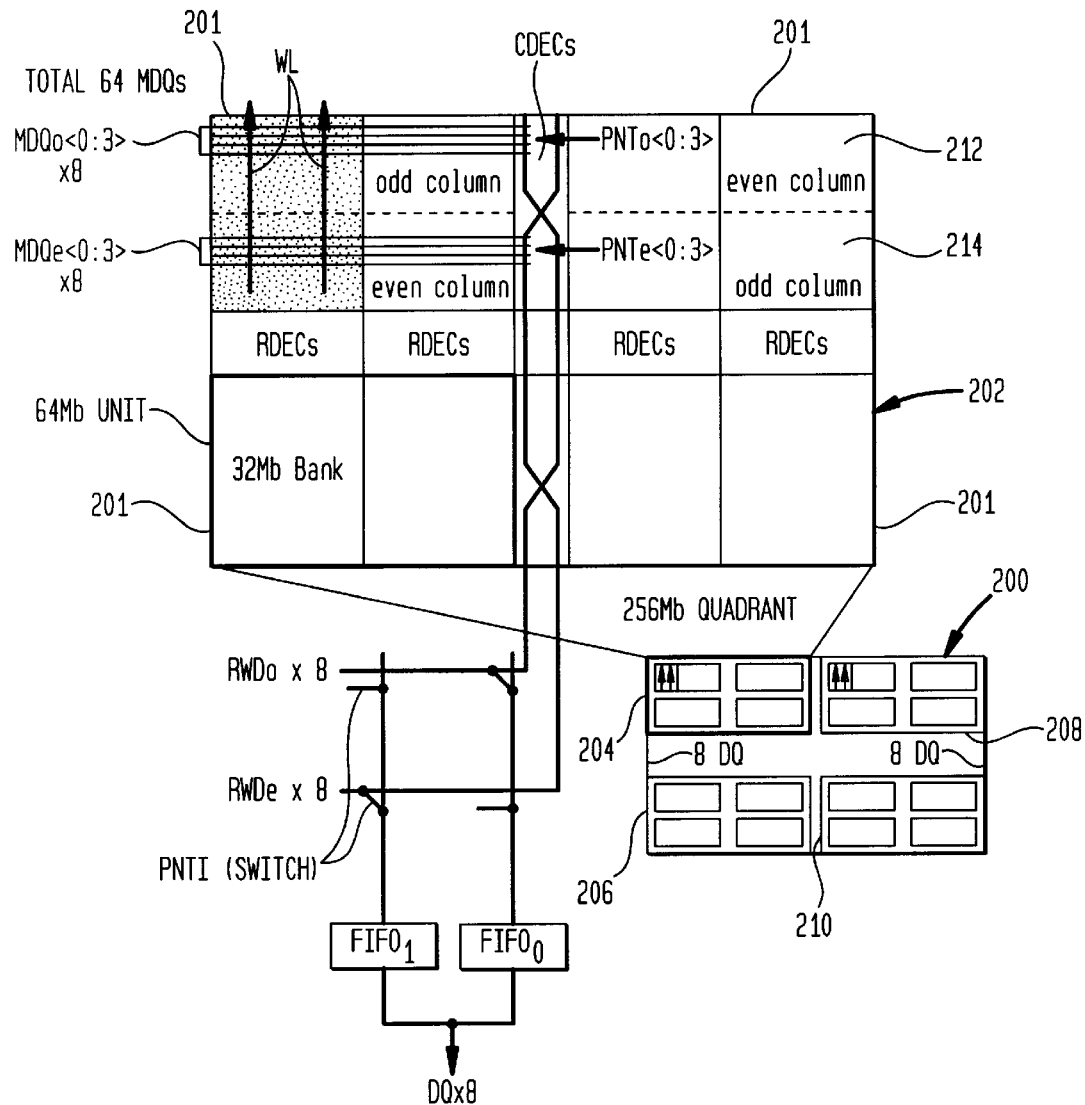
FIG. 4 is a schematic/block diagram of a 1 Gb SDRAM chip showing prefetch at FIFOs in accordance with the present invention.
Figure 5:
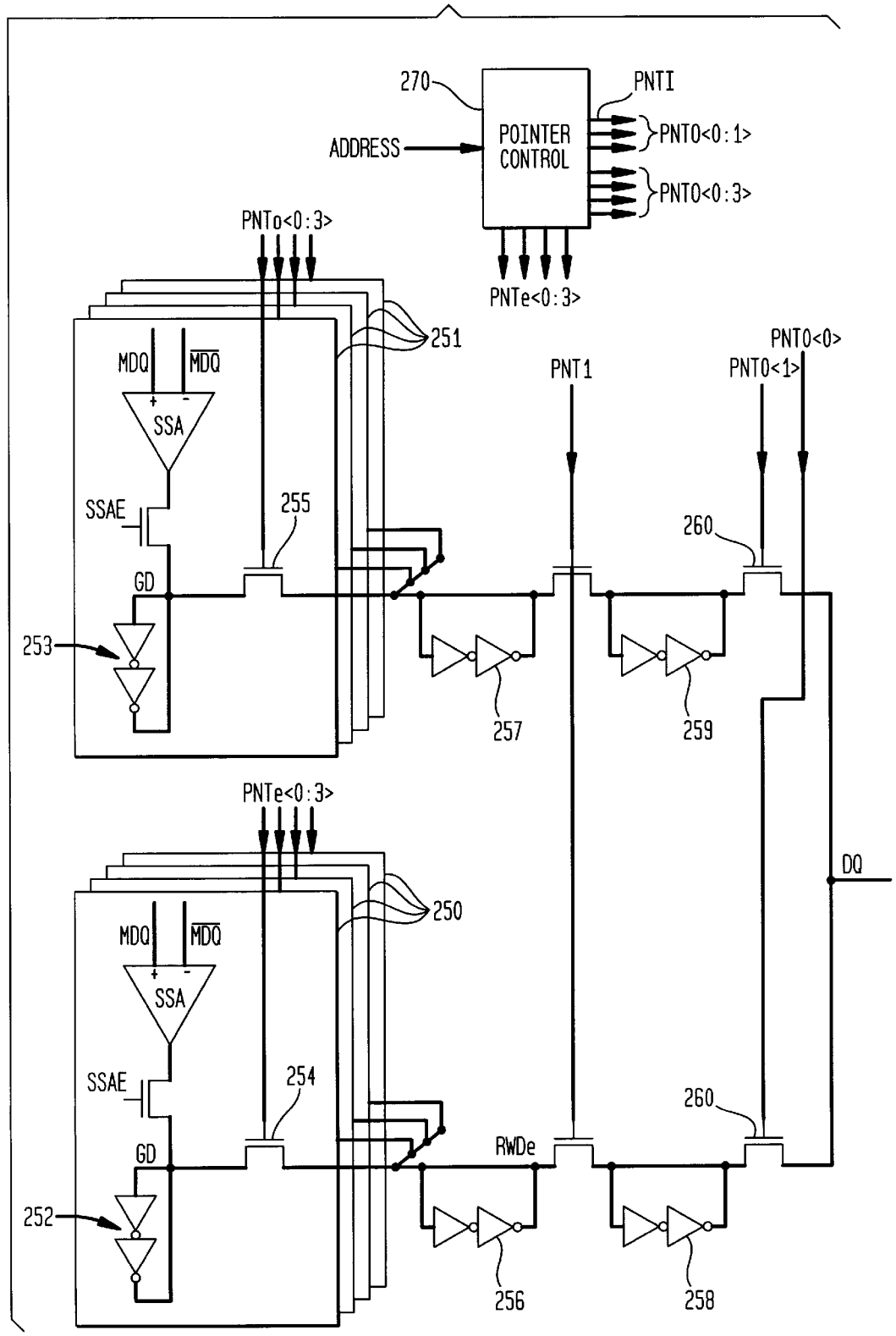
FIG. 5 is a schematic diagram of a SSA and FIFO control circuits in accordance with the present invention.

The 8-bit hierarchical prefetch architecture of the present invention advantageously supports sequential and interleave burst operation with any starting address. The bit transfer between prefetched stages is controlled by pointer signals, generated by a pointer control circuit 270 (FIG. 5). The pointers are designated by PNTo and PNTe (FIG. 4). Internal addresses for PNTe<0:3>, which together with PNTo<0:3> are used to transfer the data from the SSA to the FIFO in the correct burst sequence, are preferably incremented from address 0, thus allowing a sequential burst sequence starting with an odd address (0+1) (even addresses may be implemented as starting addresses as well). If an address n is a starting address (odd or even), incrementing the address by one (e.g., n+1) up to the prefetch depth (e.g., n+7, for 8-bit prefetching) is performed to provide the next address information for the pointers. This is for sequential bursts. For interleaved bursts, a next address is determined by a formula within the prefetch depth domain (n+7 for 8-bit prefetching) which selects the address of the next bit based on the starting address (either odd or even). The control circuit 270 preferably includes logic circuitry for generating the addresses for the pointer signals.

Figure 3:
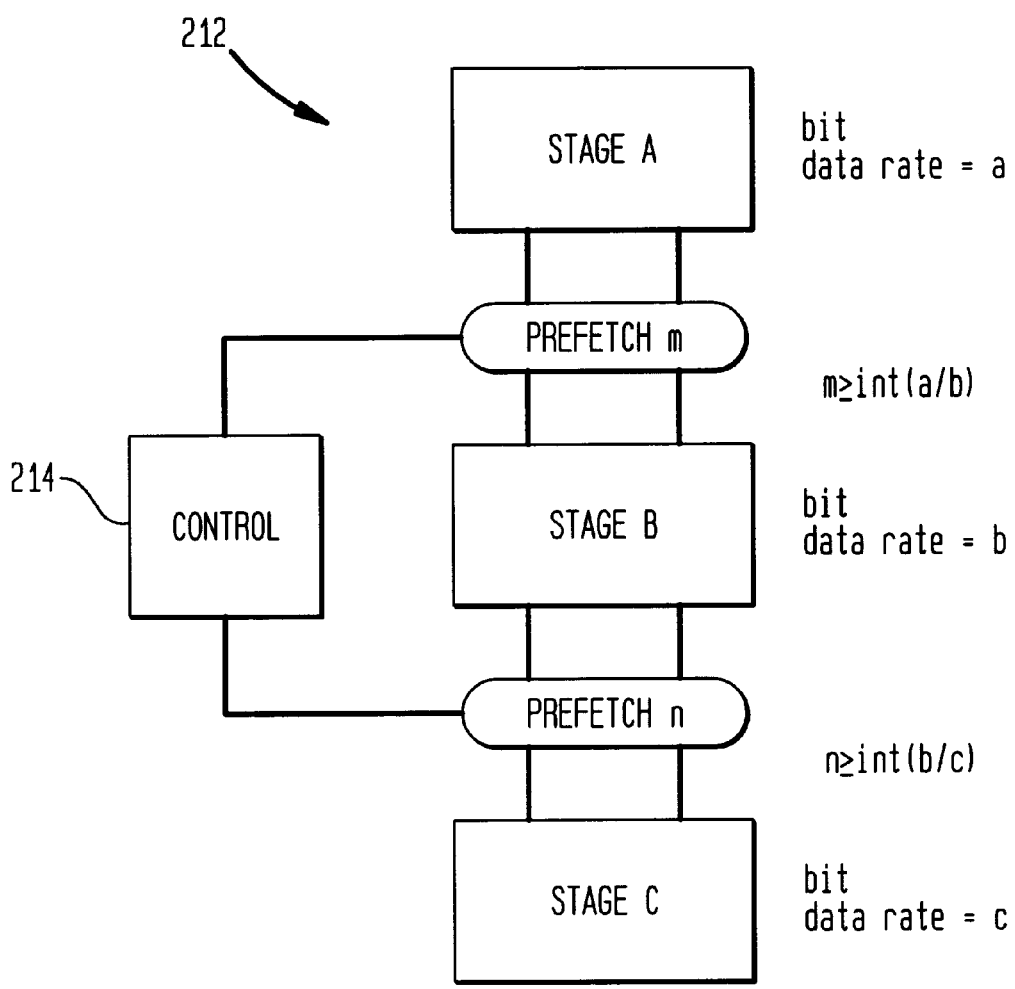
FIG. 3 is a block diagram a general form of a hierarchical prefetch circuit in accordance with the present invention.

Referring to FIG. 3, a general circuit 212 of a data path in accordance with the present invention is shown including three data path stages A–C. Stages A–C assume different data rates/signal times (data rates per bit) a, b and c, respectively. One goal of the design is to realize the chip data rate to meet a data rate/bit c with small design overhead. Note that the data rate of each stage is determined by the data rate/signal path times the number of signal paths, i.e., prefetching. This is achieved by arranging the prefetch between the stage A–B with m≧Int(a/b) (i.e., integer value with fractions rounded up to the next integer of data rates/bit divided by data rates/bit b) and the prefetch between the stage B–C with n≧Int (b/c)(i.e., integer value with fractions rounded up to the next integer of data rates/bit b divided by data rates/bit c). m and n are preferably multiples of 2 and may be adjusted accordingly. To change the prefetch depth in each stage, a pointer is designed corresponding thereto, which is one important aspect of the present invention and will be described in greater detail hereinbelow. Pointer signals are provided using control circuit 214. Control circuit 214 provides synchronization of latches included in prefetch circuits to sequentially latch data to permit optimum timing and increase the overall data rate of the data path.

Referring now to FIG. 4, a non-limiting implementation example for an 8 bit hierarchical prefetch for a 1 Gb SDRAM 200 is shown. The 1 Gb SDRAM 200 includes four 256 Mb quadrants or sections 202. Two quadrants 204 and 206 in the left chip half are associated with 8 DQs at the left chip edge, and two quadrants 208 and 210 in the right chip half are associated with 8 DQs at the right chip edge. Each section 202 is further divided into quadrants 201 (64 Mb units each) which are logically divided into even 212 and odd 214 32 Mb column-address regions. Each region 212 and 214 includes 8 sets of 4 even MDQs (MDQe<0:3>), and 8 sets of 4 odd MDQs (MDQo<0:3>). For the illustrative circuit, each set of MDQe<0:3> and MDQo<0:3> supports 8 burst-bits for the corresponding DQ as a hierarchical 8*b* prefetch. 64 bits, or 8 burst-bits×8 DQs are simultaneously read or written with 8 sets of MDQe<0:3> and MDOo<0:3> per column access. Two out of eight burst-bits on MDQe<0:3> and MDQO<0:3> are then selected by one out of four pointers (PNTe<0:3> for MDOe<0:3> and PNTo<0:3> for odd), transferring 2 consecutive burst-bits to the corresponding RWDe and RWDo simultaneously PNTe<0:3> are incremented from address 0, for example, allowing a sequential burst sequence starting with an odd address (0+1). Alternately, interleaved burst sequences may be employed using a formula for selecting addresses. The two even and odd bits on RWDe and RWDo are then fetched to two first-in-first-out circuits ($FIFO_0$ and $FIFO_1$) when FIFO input pointer (PNTI) is enabled. Actual PNTI includes a reordering switch so that the even and odd bits are stored as the first and second burst-bits in $FIFO_0$ and $FIFO_1$, respectively. The 8 RWDe's and 8 RWDo's for 8 DQs are twisted at the center of each column decoders (CDECs) and shared with the adjacent 64 Mb unit, eliminating 32 wires and about 75 μm per chip. Also shown are row decoders (RDECs). This hierarchical 8*b* prefetch architecture reduces the array and data-path frequencies to ⅛ and ½ respectively, boosting the column burst frequency over 400 Mb/s per DQ.

Referring to FIG. 5, an implementation of the circuit of FIG. 1 for the data path from MDQ to DQ is shown. 8-bit burst is supported using all PNTe<0:3> and PNTo<0:3>. In other embodiments, a 4-bit burst is employed having two out of four PNTe<0:3> and two out of four PNTo<0:3> activated. For a 2-bit burst, one out of four PNTe<0:3> and one out of four PNTo<0:3> are activated. PNTe<0:3> and PNTo<0:3> may be generated using an on chip clock signal or be provided as feedback from data path circuitry. Pointer signals are generated by a pointer control circuit 270 which outputs pointer signals designated by PNTo<0:3> and PNTe<0:3> to activate circuits 250 and 251. Internal addresses for PNTe<0:3>, which together with PNTo<0:3> are used to transfer the data from the SSA to the FIFO latches 258 and 259 in the correct burst sequence. Pointers are preferably incremented from address 0, thus allowing a sequential burst sequence starting with an odd address (even addresses may be implemented as starting addresses as well). If an address n is a starting address (odd or even), incrementing the address by one (e.g., n+1) up to the prefetch depth (e.g., n+7, for 8-bit prefetching) is performed to provide the next address for the next internal address for pointers. This is for sequential bursts. For interleaved bursts, a next address for a next internal address for pointers is determined by a formula which selects the address of the next pointer based on the starting address (either odd or even). Starting address information is input to control circuit 270 which generates addresses for pointers to retrieve the pointers in accordance with the sequencing or interleaved schemes.

The circuit shown in FIG. 5 is divided into odd column and even column circuitry. Circuits 251 each represent a SSA, at least one latch 253 and at least one switch 255 for enabling circuits 251. Circuits 250 include even column circuitry and include SSA, at least one latch 252 and at least one switch 254 for enabling circuits 250. Each circuit of circuits 250 and 251 include MDQ and MDQ bar lines as inputs. In this embodiment, 8 SSAs are included and 8 MDQ/MDQ bar pairs are included. SSAs includes an additional latch therein other than latches 252 and 253. Switches 254 and 255 are used to enable circuits 250 and 251 for data transfer in accordance with sequential burst sequences. A second sense amplifier enable SSAE permits SSA to activated and may also be used to synchronize data transfer as well. Data is stored in the latch of SSA (shown as part of SSA) and in additional latches 252 and 253 which are advantageously employed to temporarily store data until FIFO/OCD is ready to receive and transfer the data in bursts of 4 bits. In this way, 4 bit prefetching is implemented by circuits 250 and 251 and latches 252 and 253 as controlled by pointer signals PNTo<0:3> and PNTe<0:3>. Data transfer from circuits 250 and 251 continues through RWD$_o$ and RWD$_o$ which includes latches 256 and 257. Control signals PNTI, PNTO<0> and PNTO<1> alternate data transfer through FIFO latches 258 and 259 and are preferably controlled in accordance with pointer signals PNTo and PNTe. Switches 260 (FIFO output switches) which are controlled are by PNTO<0> and PNTO<1> are employed to activate and deactivate data transfer therethrough to provide 2 bit prefetching. PNTI may be provided by control circuit 270 or from another source. By implementing the circuit shown in FIG. 5, 8 bit prefetching is realized between MDQs and DQ in accordance with the present invention. The implementation shown in FIG. 5 can be extended to provide more prefetching. The implementation shown in FIG. 5 may also be employed for the embodiment shown in FIG. 2 as well as other circuits.

Having described preferred embodiments for hierarchical prefetch for semiconductor memories (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor memory comprising:
    a data path including a plurality of hierarchical stages, each stage including a bit data rate which is different from the other stages;
    at least two prefetch circuits disposed between the stages, the at least two prefetch circuits including at least two latches for receiving data bits and storing the data bits until a next stage in the hierarchy is capable of receiving the data bits, the at least two prefetch circuits being placed between stages such that an overall data rate between stages is substantially equal; and
    a control signal for controlling the at least two latches such that prefetch circuits maintain the overall data rate between the stages.

2. The semiconductor memory as recited in claim 1, wherein the prefetch circuits have a depth of 8 bits.

3. The semiconductor memory as recited in claim 1, wherein the plurality of stages includes a first stage low in the hierarchy and a second stage higher in the hierarchy having a prefetch circuit therebetween the prefetch circuit having a depth greater than or equal to a quotient of a bit data rate of the first stage divided by a bit data rate of the second stage with any fraction rounded up to the nearest integer.

4. The semiconductor memory as recited in claim 1, wherein the stages include one of sense amplifiers and first-in/first-outs.

5. The semiconductor memory as recited in claim 1, wherein the overall data rate is greater than 400 megabits per second.

6. The semiconductor memory as recited in claim 1, wherein the hierarchical stages are configured with hierarchical data lines over an array of memory cells and read/write drivers.

7. The semiconductor memory as recited in claim 1, wherein the overall data rate between stages is calculated by multiplying prefetch depth by the bit data rate for the stage.

8. A semiconductor memory chip comprising:
    a memory array having sections, each section having four quadrants, each quadrant including an odd column and an even column of memory cells;
    a data path associated with each quadrant including local data lines for transmitting memory data, the local data lines being coupled to a first stage including first sense amplifier circuits, the first stage being coupled to a second stage including second sense amplifier circuits by master data lines, the second stage being coupled to a third stage including a first-in/first-out/off chip driver circuit by read/write driver lines, the first-in/first-out/off chip driver circuit being coupled to an input/output pin;
    at least two latch circuits disposed within the stages for providing prefetch capability for data to be transmitted through the data path, the at least two latch circuits for receiving data bits and storing the data bits until a next stage in the data path is capable of receiving the data bits, the at least two latch circuits being associated with the stages such that data rates between the stages are substantially equal to a desired data rate per stage; and
    control signals for controlling the at least two latch circuits such that prefetch capability is provided to maintain the data rates between the stages.

9. The semiconductor memory chip as recited in claim 8, wherein the latch circuits provide a prefetch depth of 8 bits.

10. The semiconductor memory chip as recited in claim 9, wherein the prefetch depth is distributed as 4 bits at the second stage and 2 bits at the third stage.

11. The semiconductor memory chip as recited in claim 9, wherein the prefetch depth is distributed as 2 bits at the first stage, 2 bits at the second stage and 2 bits at the third stage.

12. The semiconductor memory chip as recited in claim 8, wherein a prefetch depth is a value greater than or equal to a quotient of a bit data rate of one stage divided by a bit data rate of another stage with any fraction rounded up to the nearest integer.

13. The semiconductor memory chip as recited in claim 8, wherein the semiconductor memory chip includes an overall data rate of greater than 400 megabits per second.

14. The semiconductor memory chip as recited in claim 8, wherein the control signals include pointer signals for transferring the data between the stages in a correct burst sequence.

15. The semiconductor memory chip as recited in claim 8, wherein the semiconductor memory chip is one of a synchronous DRAM chip, a rambus DRAM chip and a SyncLink DRAM chip.

16. The semiconductor memory chip as recited in claim 8, wherein the second stage includes switches for enabling the second stage and the control signals include pointer signals for activating and deactivating the switches.

17. The semiconductor memory chip as recited in claim 8, wherein third stage includes switches for enabling the third stage and the control signals include control signals for activating and deactivating the switches.

18. The semiconductor memory chip as recited in claim 8, wherein a bit data rate for the first stage is about 20 ns per bit.

19. The semiconductor memory chip as recited in claim 8, wherein a bit data rate for the second stage is between about 10 ns per bit to about 20 ns per bit.

20. The semiconductor memory chip as recited in claim 8, wherein a bit data rate for the third stage is about 5 ns per bit.

21. The semiconductor memory chip as recited in claim 8, further comprises a control circuit for incrementing addresses from one of even and odd starting addresses to provide sequential addresses for generating the control signals.

22. The semiconductor memory chip as recited in claim 8, further comprises a control circuit for formulating addresses from one of even and odd starting addresses to provide interleaved addresses for generating the control signals.

23. The semiconductor memory chip as recited in claim 8, wherein the overall data rate between stages is calculated by multiplying prefetch depth by the bit data rate for the stage.

* * * * *